United States Patent
Liu et al.

(10) Patent No.: US 7,842,971 B2
(45) Date of Patent: Nov. 30, 2010

(54) SILICON-CONTROLLED RECTIFIER (SCR) DEVICE FOR HIGH-VOLTAGE ELECTROSTATIC DISCHARGE (ESD) APPLICATIONS

(75) Inventors: Zhiwei Liu, Orlando, FL (US); Juin J. Liou, Oviedo, FL (US); James E. Vinson, Palm Bay, FL (US)

(73) Assignees: Intersil Americas Inc., Milpitas, CA (US); University of Central Florida Research Foundation, Inc., Orlando, FL (US)

( * ) Notice: Subject to any disclaimer, the term of this patent is extended or adjusted under 35 U.S.C. 154(b) by 38 days.

(21) Appl. No.: 12/366,159

(22) Filed: Feb. 5, 2009

(65) Prior Publication Data

US 2009/0212323 A1    Aug. 27, 2009

Related U.S. Application Data

(60) Provisional application No. 61/030,595, filed on Feb. 22, 2008.

(51) Int. Cl.
*H01L 29/74* (2006.01)
(52) U.S. Cl. .................. 257/173; 257/355; 257/511
(58) Field of Classification Search .................. 257/173, 257/355, 511
See application file for complete search history.

(56) References Cited

U.S. PATENT DOCUMENTS

| | | | |
|---|---|---|---|
| 5,808,342 A | 9/1998 | Chen et al. | |
| 5,959,821 A | 9/1999 | Voogel | |
| 6,476,422 B1 | 11/2002 | Yu | |
| 6,521,952 B1 | 2/2003 | Ker et al. | |
| 6,573,566 B2 | 6/2003 | Ker et al. | |
| 6,576,959 B2 | 6/2003 | Kunz et al. | |
| 6,594,132 B1 | 7/2003 | Avery | |
| 6,720,624 B1 | 4/2004 | Vashchenko et al. | |
| 6,765,771 B2 | 7/2004 | Ker et al. | |
| 6,803,633 B2 | 10/2004 | Mergens et al. | |
| 6,946,690 B1 | 9/2005 | Vashchenko et al. | |
| 6,960,792 B1 | 11/2005 | Nguyen | |
| 7,060,538 B2 | 6/2006 | Steinhoff | |
| 7,071,528 B2 | 7/2006 | Ker et al. | |

(Continued)

FOREIGN PATENT DOCUMENTS

WO    2006014875 A2    2/2006

OTHER PUBLICATIONS

Vashchenko et al., "High Holding Voltage Cascoded LVTSCR Structures for 5.5-V Tolerant ESD Protection Clamps", IEEE Transactions on Device and Materials Reliability, vol. 4, pp. 273-280, Jun. 2004.

(Continued)

*Primary Examiner*—Long Pham
(74) *Attorney, Agent, or Firm*—MH2 Technology Law Group LLP

(57) ABSTRACT

A silicon-controlled rectifier (SCR) device having a high holding voltage includes a PNP transistor and an NPN transistor, each transistor having both p-type and n-type dopant regions in their respective emitter areas. The device is particularly suited to high voltage applications, as the high holding voltage provides a device which is more resistant to latchup subsequent to an electrostatic discharge event compared to devices having a low holding voltage.

12 Claims, 13 Drawing Sheets

U.S. PATENT DOCUMENTS 7,217,980 B2    5/2007    Chen et al.

OTHER PUBLICATIONS

Vashchenko et al, "Comparison of ESD Protection Capability of Lateral BJT, SCR and Bi-directional SCR for High-Voltage BiCMOS Circuits", in Proc. Bipolar/BiCMOS Circuits and Technology Meeting (BCTM), 2002, pp. 181-184.

Hsu et al., "Dependence of Device Structures on Latchup Immunity in a High Voltage 40-V CMOS Process with Drain-Extended MOSFETs", IEEE Transactions on Electron Devices, vol. 54, Apr. 2007.

Ker et al., "Overview of On-chip Electrostatic Discharge Protection Design with SCR-based Devices in CMOS Integrated Circuits", IEEE Transactions on Device and Material Reliability, vol. 5, No. 2, Jun. 2005.

Quittard et al., "ESD Protection for High-voltage CMOS Technologies", in Proc. EOS/ESD Symposium, pp. 77-86, 2006.

Vashchenko et al., "Emitter Injection Control in LVTSCR for Latch-up Free ESD Protection", International Microelectronics Conference, Nis, Yugoslavia, May 12-15, 2002.

Lin et al., "Design on Latchup-Free Power-Rail ESD Clamp Circuit in High-voltage CMOS ICs", in Proc. of the EOS/ESD Symposium, 2004.

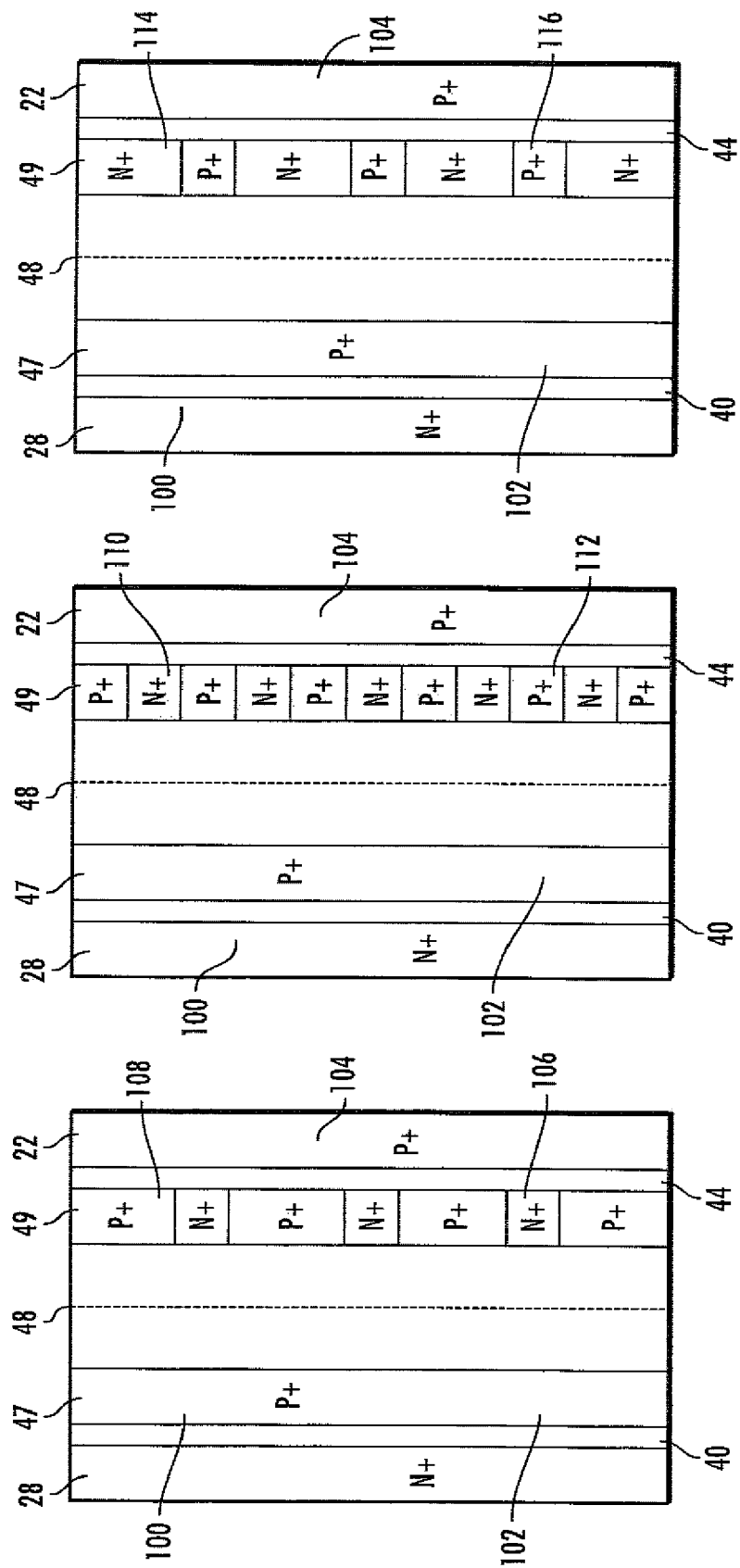

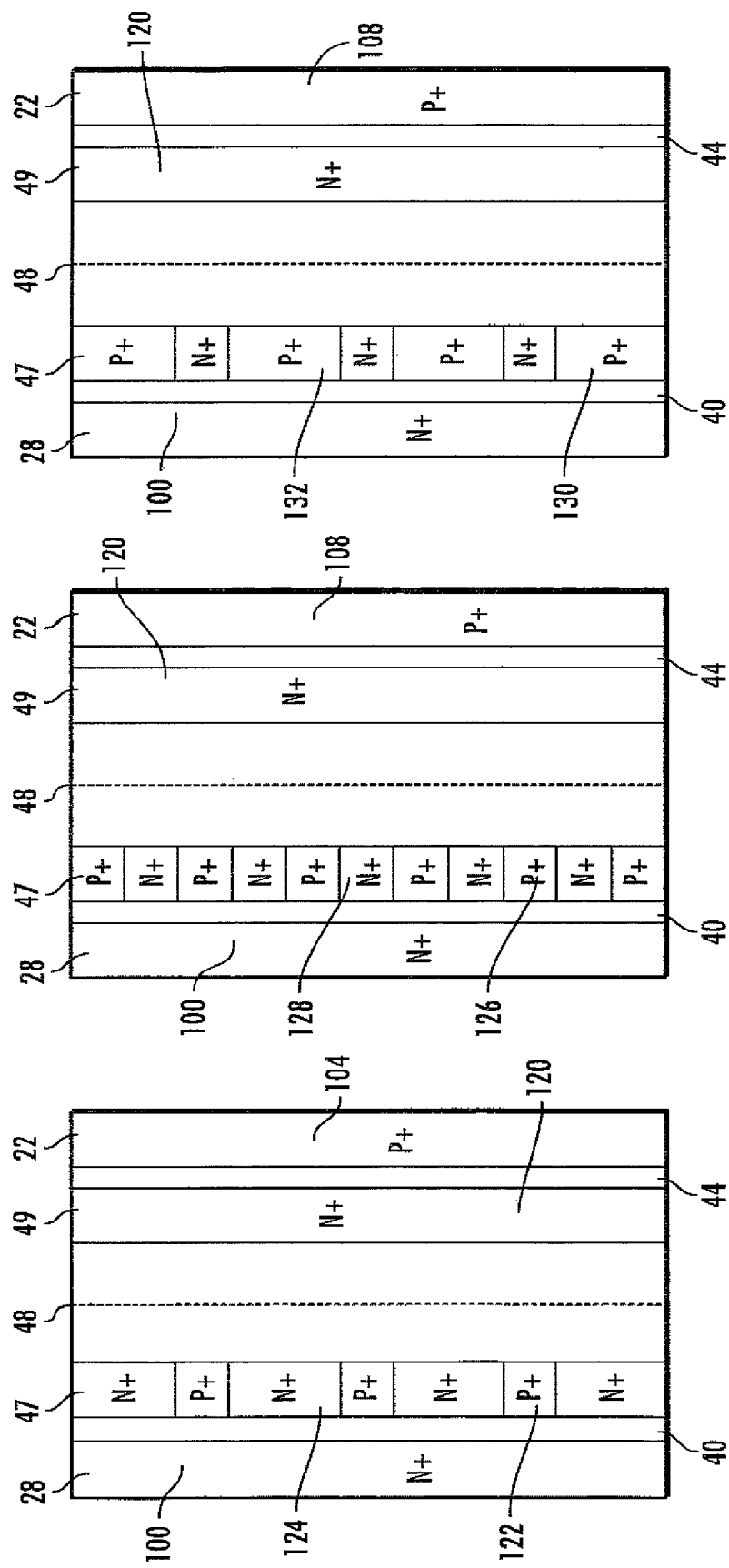

SILICON-CONTROLLED RECTIFIER (SCR) DEVICE FOR HIGH-VOLTAGE ELECTROSTATIC DISCHARGE (ESD) APPLICATIONS

CROSS-REFERENCE TO RELATED APPLICATION

This application claims priority to provisional U.S. patent application Ser. No. 61/030,595, filed Feb. 22, 2008.

FIELD OF THE INVENTION

This invention relates to the field of semiconductor devices, and more particularly to silicon-controlled rectifiers, for example those used to protect against electrostatic discharge in high-voltage applications.

BACKGROUND OF THE INVENTION

Electrostatic discharge (ESD) protection for high-voltage integrated circuits is challenging due to the requirement of high holding voltage to minimize the risk of ESD latchup. Silicon controlled rectifiers (SCR's) are attractive devices for ESD protection applications, for example because of their inherent bipolar conductivity modulation mechanism which can provide a deep snapback characteristic with a relatively small holding voltage, in the range of 1.0 to 2.0 V. This characteristic can reduce power dissipation in the SCR during an ESD event and result in a device which can be more robust when exposed to ESD than other devices such as diodes and grounded-gate NMOS (GGNMOS) devices.

A conventional twin-well SCR which can be used in low voltage ESD applications is depicted as a circuit schematic at FIG. 1, and as a cross section of one possible physical layout of the FIG. 1 circuit at FIG. 2. A top view of the FIG. 2 structure is depicted in FIG. 3.

FIG. 1 depicts a PNP parasitic bipolar junction transistor (BJT) 10, an NPN parasitic BJT 12, a first resistor R_pwell 14, and a second resistor R_nExt 16. The PNP device includes an emitter 18, a base 20, and a collector 22, and the NPN device has an emitter 24, a base 26, and a collector 28. The devices are electrically coupled with an anode 30, which can be coupled to a bond pad, and a cathode 32. The cross section of FIG. 2 depicts a cross section of one possible physical layout of the FIG. 1 circuit. FIG. 2 depicts anode 30, cathode 32, PNP emitter 18, base 20, and collector 22, NPN emitter 24, base 26, and collector 28. The PNP base 20 is provided by an N extension 33, which also provides R_nExt resistor 16. The NPN base 26 is provided by a P-well 34, which also provides R_pwell resistor 14. These structures can be formed within an N-type epitaxial layer 35, which in turn can be formed over a P-type silicon semiconductor substrate assembly 36. FIG. 2 further depicts isolation regions 38-46, which can be shallow trench isolation (STI) or LOCOS field isolation.

A blocking junction 48 of the N-Extension 33 and the P-Well 34 controls the SCR triggering. The doping of the N-Extension 33 and the P-Well 34 is designed to form a blocking junction 48 which yields a trigger voltage as high as 45 V for high-voltage ESD protection. Avalanche breakdown of this blocking junction 48 injects carriers into the N-Extension 33 and P-Well 34, thereby biasing the NPN 12 and PNP 10 transistors ON. Electrons added from the NPN emitter 24 and holes from the PNP emitter 18 reinforce the avalanche breakdown, creating a positive feedback. Once the gain of the system exceeds unity, the SCR will enter its ON state and the anode to cathode potential will drop to the holding voltage ($V_H$).

The FIG. 2 structure can be implemented in the FIG. 3 top view of the FIG. 2 structure, demonstrating the use of strip technology. The topology depicted consists of a strip 18 of p-type dopant material which provides the P+ diffusion region for the emitter of the PNP device 10, and a strip 24 of n-type dopant material which provides the N+ diffusion region for the emitter of NPN device 12. The strips are uniformly doped with the appropriate dopant materials to the dopant concentrations sufficient for operation of the device. FIG. 2 further depicts a distance D1 which is the width of the PNP emitter 18 and NPN emitter 24, D2 which is the distance between the PNP emitter 18 and the NPN collector 28 and also the distance between the NPN emitter 24 and the PNP collector 22, D3 which is the width of the PNP collector 22 and also the width of the NPN collector 28, D4 which is the distance from the edge of the PNP collector 22 and the edge of the P Well 34 and also the distance from the edge of the NPN collector 28 and the edge of the N Extension 33, D5 which is the distance from the edge of the PNP emitter 18 and the blocking junction 48, and D6 which is the distance from the edge of the NPN emitter and the blocking junction 48. In addition to the features depicted in FIGS. 2 and 3, various other conventional features will be formed over and on the structures depicted in a completed semiconductor device.

When using SCR's for ESD protection of high-voltage integrated circuits, however, the small holding voltage $V_H$ becomes problematic, particularly for the case of a supply clamp connected between two supply rails with a voltage difference of more than 30 or 40 V. This is because the SCR is susceptible of being latched up unless the SCR's holding voltage is larger than the supply voltage difference. Specifically, in high voltage applications subsequent to an ESD event, an inability to shut off the latchup state can occur.

Various SCR structures aimed at increasing the holding voltage have been reported. For example, the article "High holding voltage cascoded LVTSCR structures for 5.5-V tolerant ESD protection clamps" (Vladislav A. Vashchenko, Ann Concannon, Marcel ter Beek, and Peter Hopper, IEEE Transactions on Device and Materials Reliability, vol. 4, pp. 273-280, June 2004) proposes a low-voltage trigger SCR (LVTSCR) with a high holding voltage based on reducing the parasitic BJT emitter area. However, the increase of the holding voltage was not sufficiently large for high-voltage IC ESD applications. Also, the article "ESD protection for high-voltage CMOS technologies" (Olivier Quittard, Zeljko Mrcarica, Fabrice Blanc, Guido Notermans, Theo Smedes, and Hans van Zwol, in Proc. EOS/ESD Symposium, pp. 77-86, 2006) proposes a structure which can be used to realize a high voltage supply clamp design by stacking several MOS transistors. However, this structure uses a large silicon area.

A device which provides an SCR for high voltage applications and which has a high holding voltage $V_H$ would be desirable.

SUMMARY OF THE EMBODIMENTS

In accordance with various embodiments of the invention, a semiconductor device comprises a PNP bipolar transistor comprising an emitter formed in a PNP emitter area. The PNP emitter area comprises at least two separate segments having a p-type conductivity and at least two separate segments having an n-type conductivity. A width of each of the at least two separate segments in the PNP emitter area having the p-type conductivity is about equal to a width of each of the at least two separate segments in the PNP emitter area having the n-type conductivity.

This embodiment of the device further comprises an NPN bipolar transistor comprising an emitter formed in an NPN emitter area. The NPN emitter area comprises at least two separate segments having an n-type conductivity and at least two separate segments having a p-type conductivity, wherein a width of each of the at least two separate segments in the NPN emitter area having the n-type conductivity is about equal to a width of each of the at least two separate segments in the NPN emitter area having the p-type conductivity.

In another embodiment of the invention, a semiconductor device comprises a PNP bipolar transistor comprising an emitter and a collector, wherein the PNP bipolar transistor collector has only an n-type conductivity. The device further comprises an NPN bipolar transistor comprising an emitter and a collector, wherein the NPN bipolar transistor collector has only a p-type conductivity. One of the PNP bipolar transistor emitter and the NPN bipolar transistor emitter has only one of the n-type conductivity and the p-type conductivity, and the other of the PNP bipolar transistor emitter and the NPN bipolar transistor emitter has both an n-type conductivity and a p-type conductivity.

Another embodiment, a method for forming a semiconductor device, comprises forming a PNP bipolar transistor and an NPN bipolar transistor. Formation of the PNP bipolar transistor and the NPN bipolar transistor comprises masking a PNP emitter area and an NPN emitter area with a first mask having openings therein, implanting n-type dopants through the openings in the first mask into both the PNP emitter area and the NPN emitter area to form at least two separate n-type segments in the PNP emitter area and at least two separate n-type segments in the PNP emitter area, and masking the PNP emitter area and the NPN emitter area with a second mask having openings therein. P-type dopants are implanted through the openings in the second mask into both the PNP emitter area and the NPN emitter area to form at least two separate p-type segments in the PNP emitter area and at least two separate p-type segments in the NPN emitter area. A width of the p-type segments in the PNP emitter area, a width of the p-type segments in the NPN emitter area, a width of the n-type segments in the PNP emitter area, and a width of the n-type segments in the NPN emitter area are all about the same width.

BRIEF DESCRIPTION OF THE DRAWINGS

The accompanying drawings, which are incorporated in and constitute a part of this specification, illustrate embodiments of the invention and together with the description, serve to explain the principles of the invention. In the figures:

FIG. 11 is a plan view depicting three asymmetrical segmented topology designs with both n-type and p-type doped regions on the NPN (cathode) emitter and a single p-type doped region on the PNP (anode) emitter;

FIG. 12 is a plan view depicting three asymmetrical segmented topology designs wherein the PNP (anode) emitter comprises regions having both n-type and p-type conductivity, and the NPN (cathode) emitter comprises a single region having n-type conductivity;

It should be noted that some details of the FIGS. have been simplified and are drawn to facilitate understanding of the inventive embodiments rather than to maintain strict structural accuracy, detail, and scale.

DESCRIPTION OF THE EMBODIMENTS

Reference will now be made in detail to the present exemplary embodiments of the invention, examples of which are illustrated in the accompanying drawings. Wherever possible, the same reference numbers will be used throughout the drawings to refer to the same or like parts.

Various embodiments of the present teachings comprise a silicon controlled rectifier which has a high holding voltage ($V_H$), and thus lends itself for use in applications where the supply voltage is high. In these applications, conventional SCR's are susceptible to latchup, for example because it is difficult to provide a device wherein $V_H$ is higher than the supply voltage.

Figure 1:
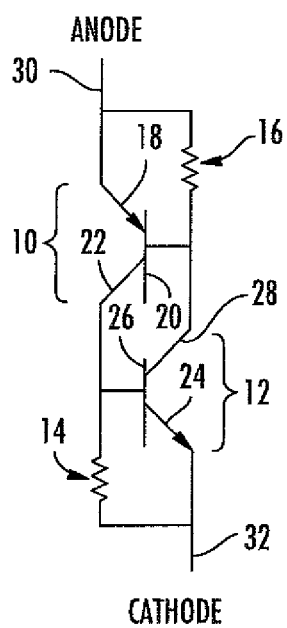
FIG. 1 is a circuit schematic for a conventional silicon-controlled rectifier (SCR)
Figure 2:
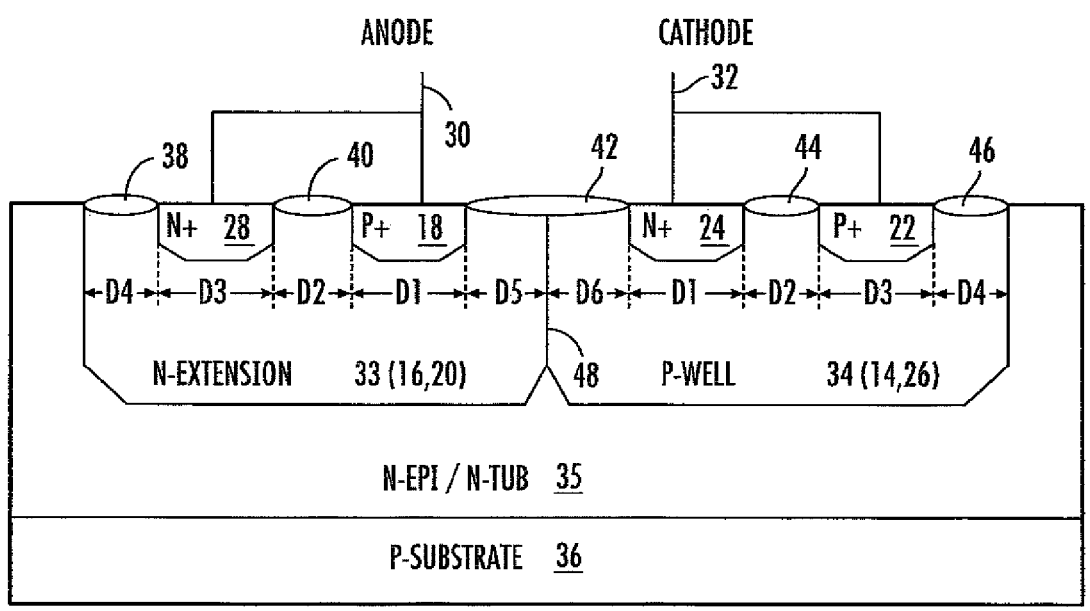
FIG. 2 is a cross section depicting one possible physical translation of the FIG. 1 circuit schematic.
Figure 3:
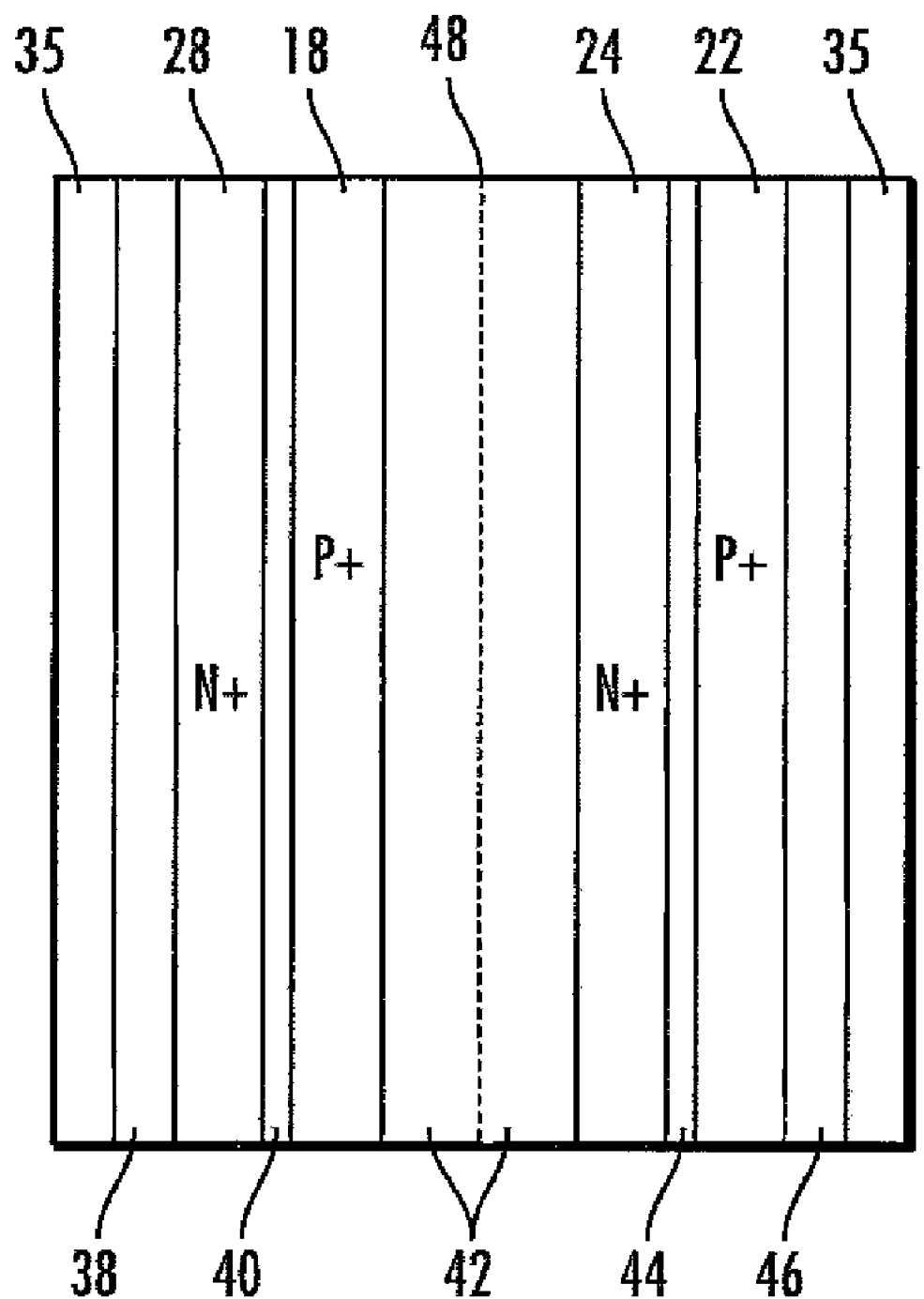
FIG. 3 is a plan view depicting the FIG. 2 structure.
Figure 4:
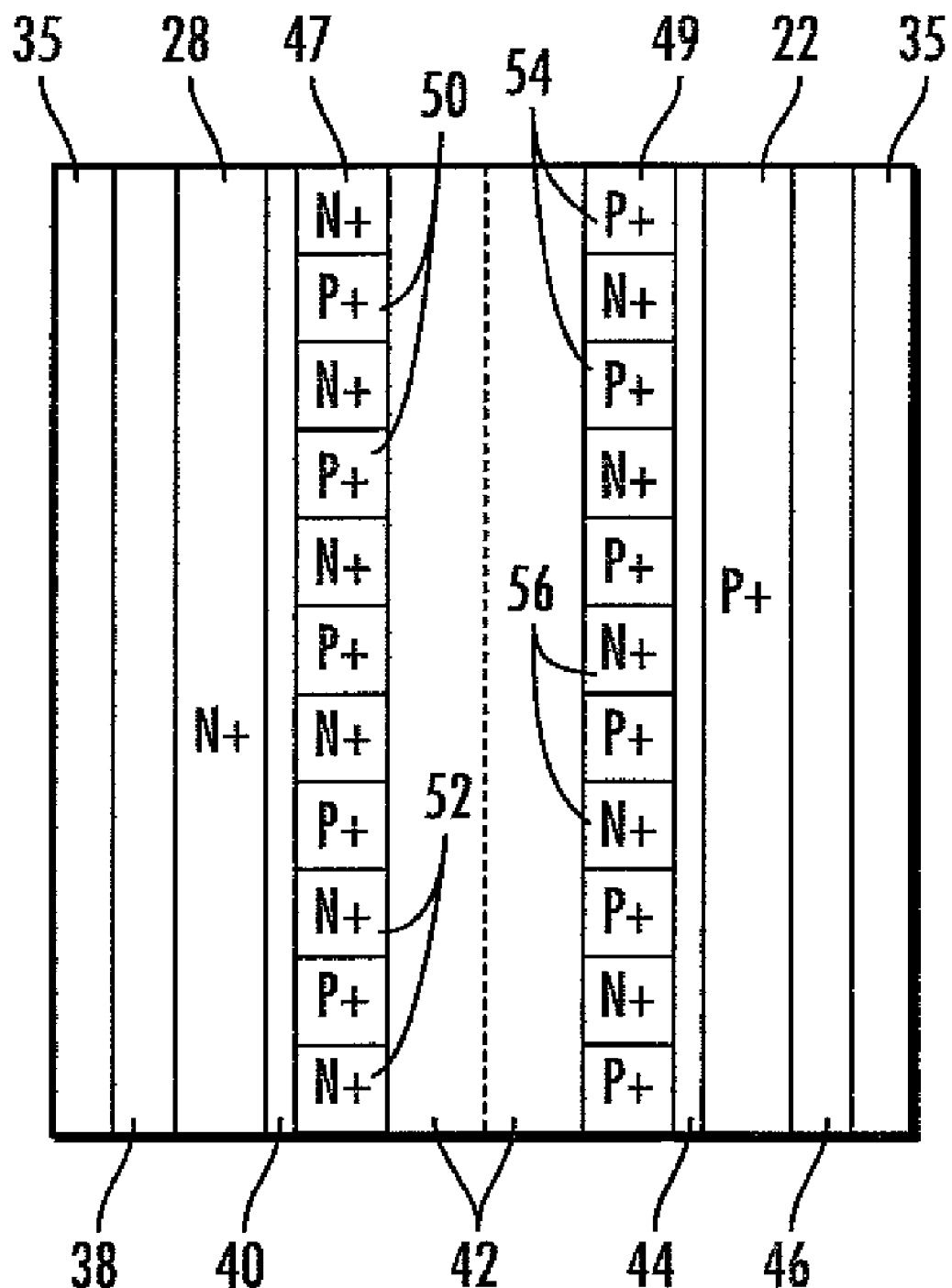
FIG. 4 is a plan view depicting a first embodiment of the invention.

FIG. 4 depicts a top view of an embodiment of the invention. This embodiment comprises the use of "segmented topology" in which PNP emitter strip 18 and NPN emitter strip 24 of FIG. 3 are replaced with the segments of FIG. 4. With the segmented topology of this embodiment, the PNP emitter area 47 and the NPN emitter area 49 each comprise alternating P-type regions and N-type regions. In the present disclosure, the segmented regions 47 and 49 are referred to as "emitter areas" because it is believed that only the portions of the regions implanted with the appropriate dopant (i.e., p-type for the PNP device and n-type for the NPN device) function as a portion of the emitter, while the regions having the opposite conductivity remain inactive during device operation. In the FIG. 4 embodiment, doped regions 50 form P-type regions of the PNP emitter, and regions 52 form N-type regions of the PNP emitter. Further, regions 54 form P-type regions of the NPN emitter, and regions 56 form of N-type regions of the NPN emitter.

The emitter injection efficiency factor can be expressed as:

$$\gamma \approx \frac{1}{1 + \frac{N_B}{N_E} \cdot \frac{D_E}{D_B} \cdot \frac{x_B}{x_E}}$$

where $N_B$ is the base doping concentration, $N_E$ is the emitter doping concentration, $D_E$ and $D_B$ are the minority carrier diffusion coefficients in emitter and base regions, respectfully, $x_B$ is the width of the neutral base region, and $x_E$ is the width of the neutral emitter region. Based on this equation and without being limited by theory, the emitter injection efficiency can be decreased by: increasing the base length; decreasing the emitter length; increasing the base doping concentration; decreasing the emitter doping concentration; or reducing the area of the emitter Changing a portion of each emitter to the opposite conductivity type, in effect, decreases the emitter areas such that the emitter injection efficiencies of these two regions are reduced. This results in an increase in the holding voltage $V_H$. In principle, SCR $V_H$ can be increased by decreasing the emitter injection efficiency of the bipolar transistors imbedded in the SCR.

Additionally, as depicted in FIG. 4, PNP emitter regions which are adjacent to NPN emitter regions at a perpendicular direction across isolation region 42 have opposite conductivity types. In the vertical direction, each separate segment of the emitter column is equal in width to the other separate segments in the column. (As used herein, two "separate" segments refers to two segments having a first type conductivity with another segment having a different dopant conductivity interposed between the two separate segments.) Further, each emitter segment is immediately adjacent to another emitter segment, with no undoped portion existing between adjacent segments.

In FIG. 4, the segmented emitter topology depicted comprises a replacement of 50% of the P+ diffusion regions for the emitter of PNP device with N+ diffusion regions. Similarly, 50% of the N+ diffusion regions for the emitter of the NPN device have been replaced with P+ diffusion regions. As a result, this exemplary embodiment comprises a "segment ratio" of 1:1/1:1. The emitter on the anode side has 1 original P+ region for every 1 N+ replacement, and the emitter on the cathode side has 1 original N+ region for every 1 P+ replacement. That is, the length of each original dopant segment is the same length as each replaced dopant segment (i.e. 50% of the conventional strip emitter diffusion for each of the PNP and NPN devices remains and 50% has been replaced with a diffusion material of the opposite conductivity type) and the emitter replacements are the same on both the anode side and the cathode side.

Figure 5:
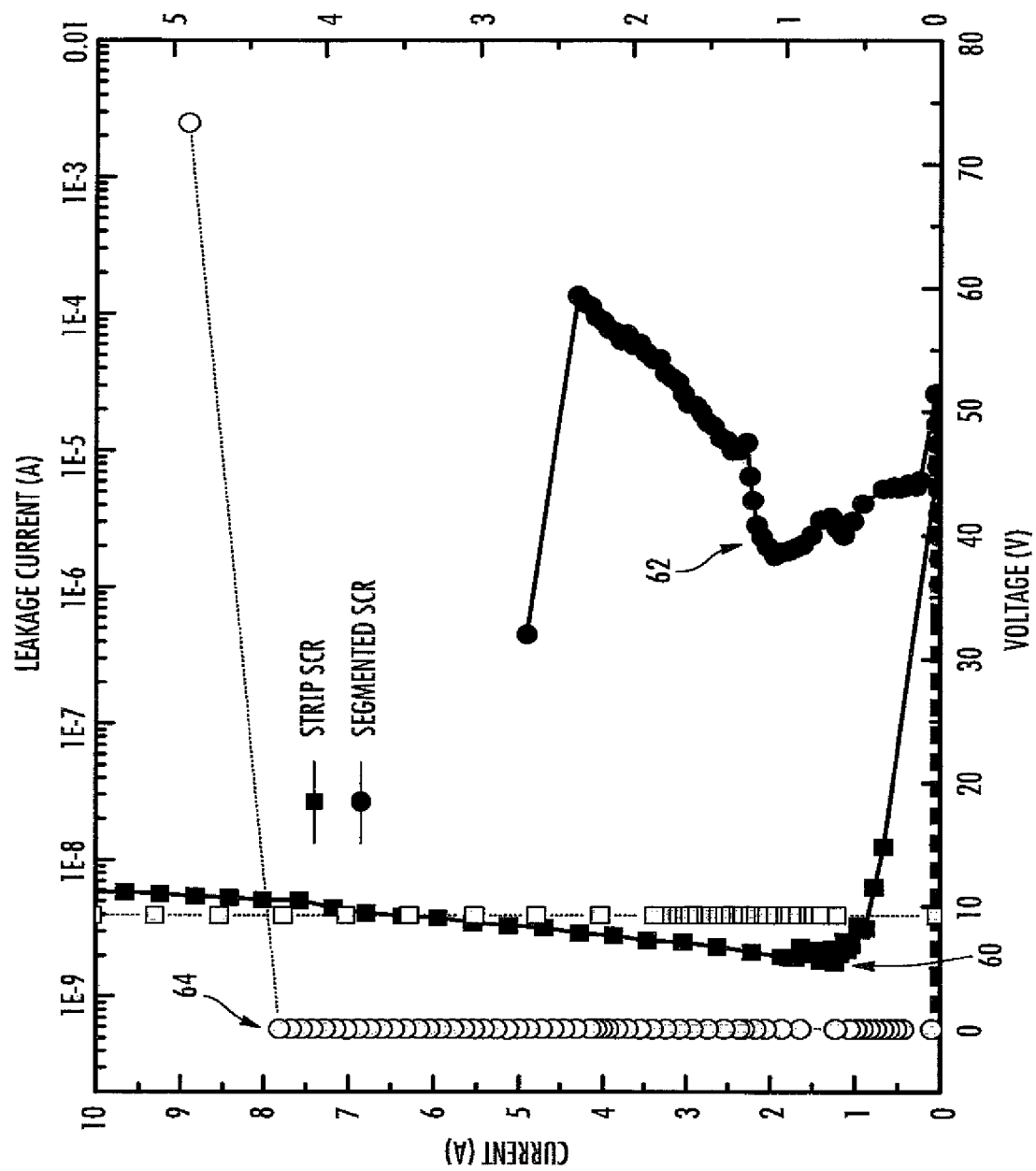
FIGS. 5 and 6 are graphs which compare electrical characteristics of a conventional SCR device with an inventive embodiment of an SCR device.

FIG. 5 is a graph comparing transmission line pulse (TLP) current-voltage (I-V) curves of a conventional device according to the technology of FIG. 3 and a SCR device which incorporates the embodiment of FIG. 4. The conventional and inventive devices which are measured to provide the plot information for the graph of FIG. 3 each comprise an emitter having a width (vertical direction in FIGS. 3 and 4) of 186 micrometers (µm) and a length (horizontal direction in FIGS. 3 and 4) of 33 µm. The conventional device has the emitter strips of FIG. 3, while the inventive device has the segmented emitter topology of FIG. 4 (1:1/1:1 segmented topology). For the inventive device, each individual doped emitter region 52, 54 has a width of 186 µm and a length of 33 µm.

As reflected in the FIG. 5 graph, while the holding voltage 60 of the conventional device having strip topology is about 4 V, the holding voltage 62 of the exemplary inventive device having the segmented topology of the present teachings is greater than about 35 V, for example about 40 V. In addition, by measuring the leakage current, it can be determined that while the failure current (i.e. breakdown current, "$I_{t2}$") of the conventional device is greater than 10 A, the failure current of the device of the present embodiment is greater than about 7.5 A, for example about 8.0 A, as shown at 64, despite the measured $V_H$ increase. This is in contrast to conventional devices having an actual decrease in the size of the emitter areas, which can result in a decrease in the failure current $I_{t2}$ and can heat to unacceptable temperatures during operation.

Figure 6:
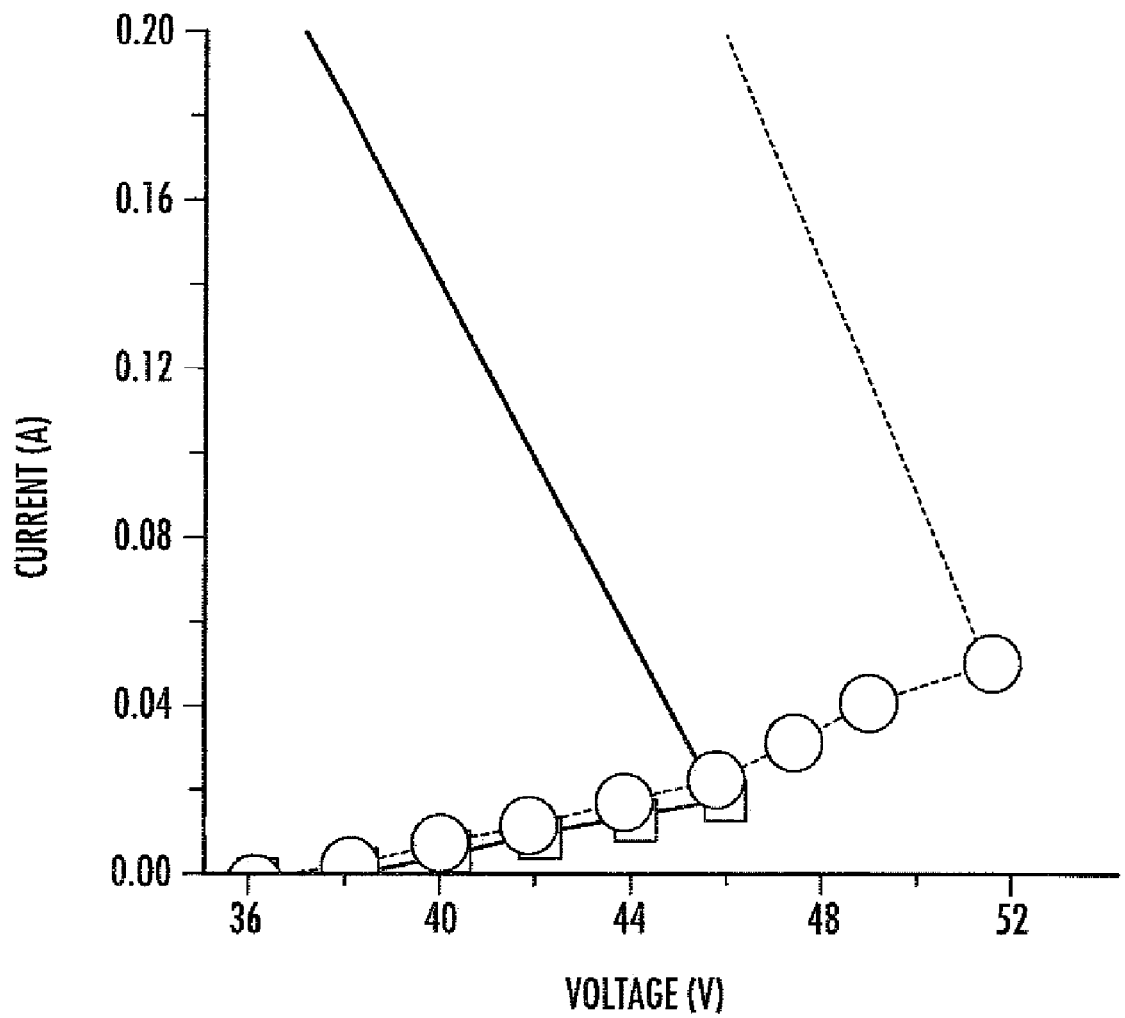

Further, as reflected in FIG. 6, the segmented SCR device possesses a slightly higher trigger voltage and current (about 52.0 V at 0.05 A) compared to the conventional device having strip topology (about 46.0 V at 0.02 A).

Figure 7:
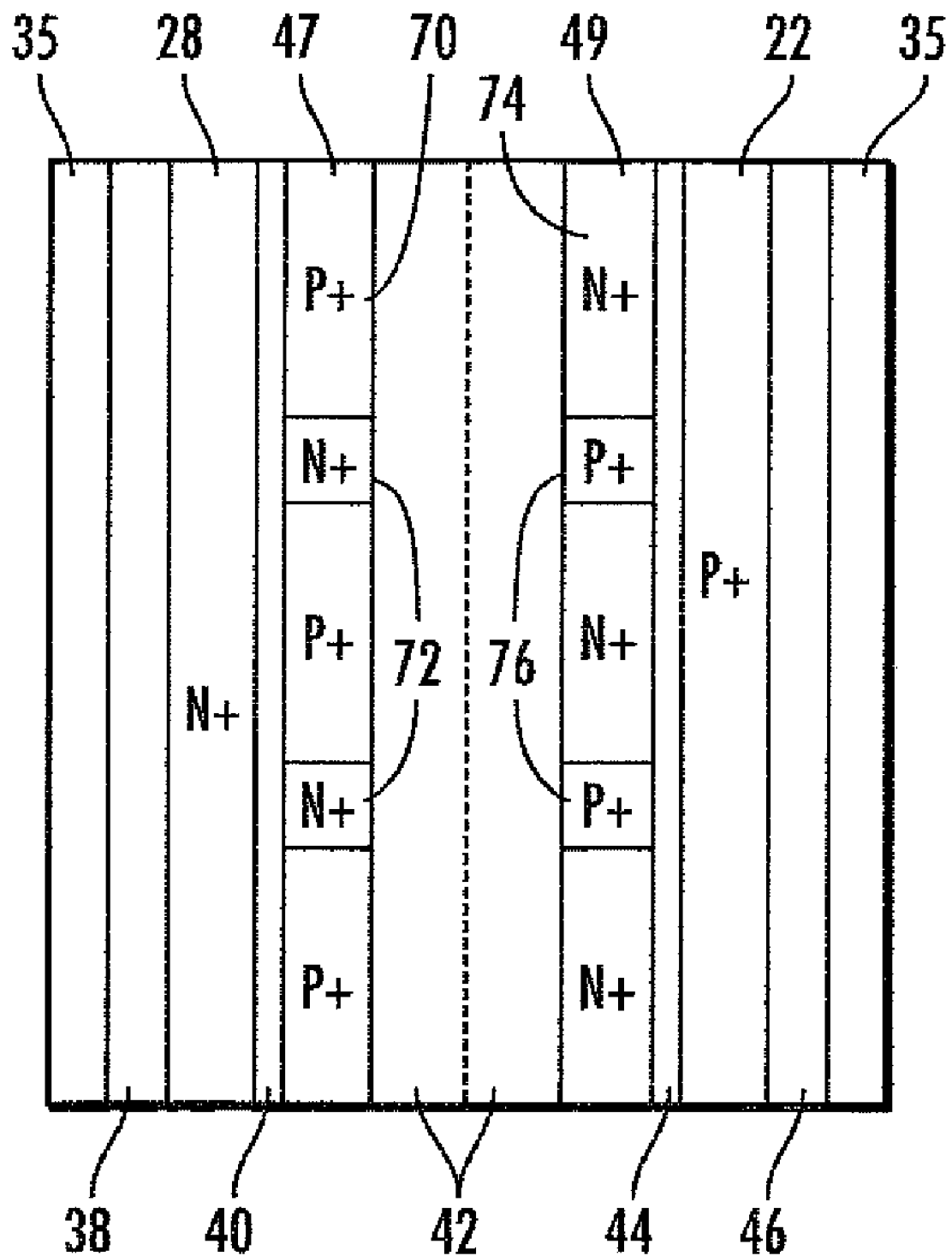
FIG. 7 is a plan view depicting a second embodiment of the invention.

While the previous embodiment comprises a device having and anode/cathode segment ratio of 1:1/1:1, devices having other anode/cathode segment ratios are also contemplated. FIG. 7 depicts a device having a segment ratio of 3:1/3:1 (the length of the original segment is three times longer than each replaced segment). Said another way, 75% of the conventional strip emitter diffusion for each of the PNP and NPN devices remains and 25% has been replaced with a diffusion material of the opposite conductivity type, to result in a segment ratio of 3:1/3:1. In the segmented topology of FIG. 7, the segmented PNP emitter area 47 comprises segments 70 doped to a P-type conductivity which are three times the length of each segment 72 doped to an N-type conductivity. The segmented NPN emitter area 49 comprises segments 74 doped to an N-type conductivity which are three times the length of each segment 76 doped to a P-type conductivity.

Figure 8:
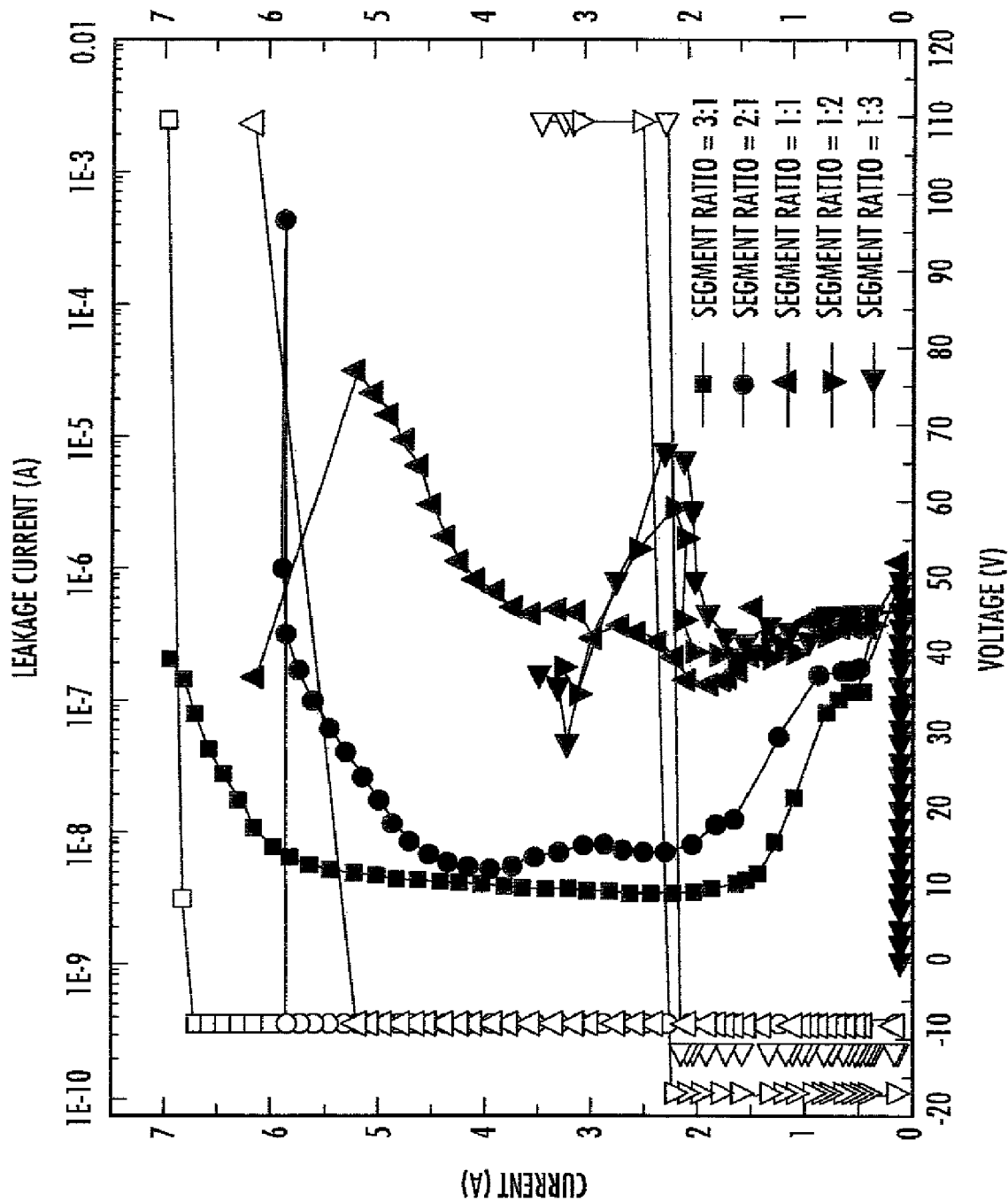
FIGS. 8 and 9 are graphs comparing various embodiments of the invention.

FIG. 8 depicts TLP results for SCR devices having five different segment ratios. It is demonstrated that the holding voltage increases quickly when the segment ratio is decreased from 3:1/3:1 (FIG. 4) to 1:1/1:1 (FIG. 7). However, increasing the segment ratio further does not appear to increase the holding voltage, and can also decrease $I_{t2}$. Without being limited to theory, it is believed that for such a small segment ratio (less than 1:1/1:1), the effective emitter area becomes excessively undersized and results in saturation of injection efficiency and current crowding near the emitter regions. The former results in an unchanged holding voltage, while the latter gives rise to a decrease in $I_{t2}$.

Figure 9:
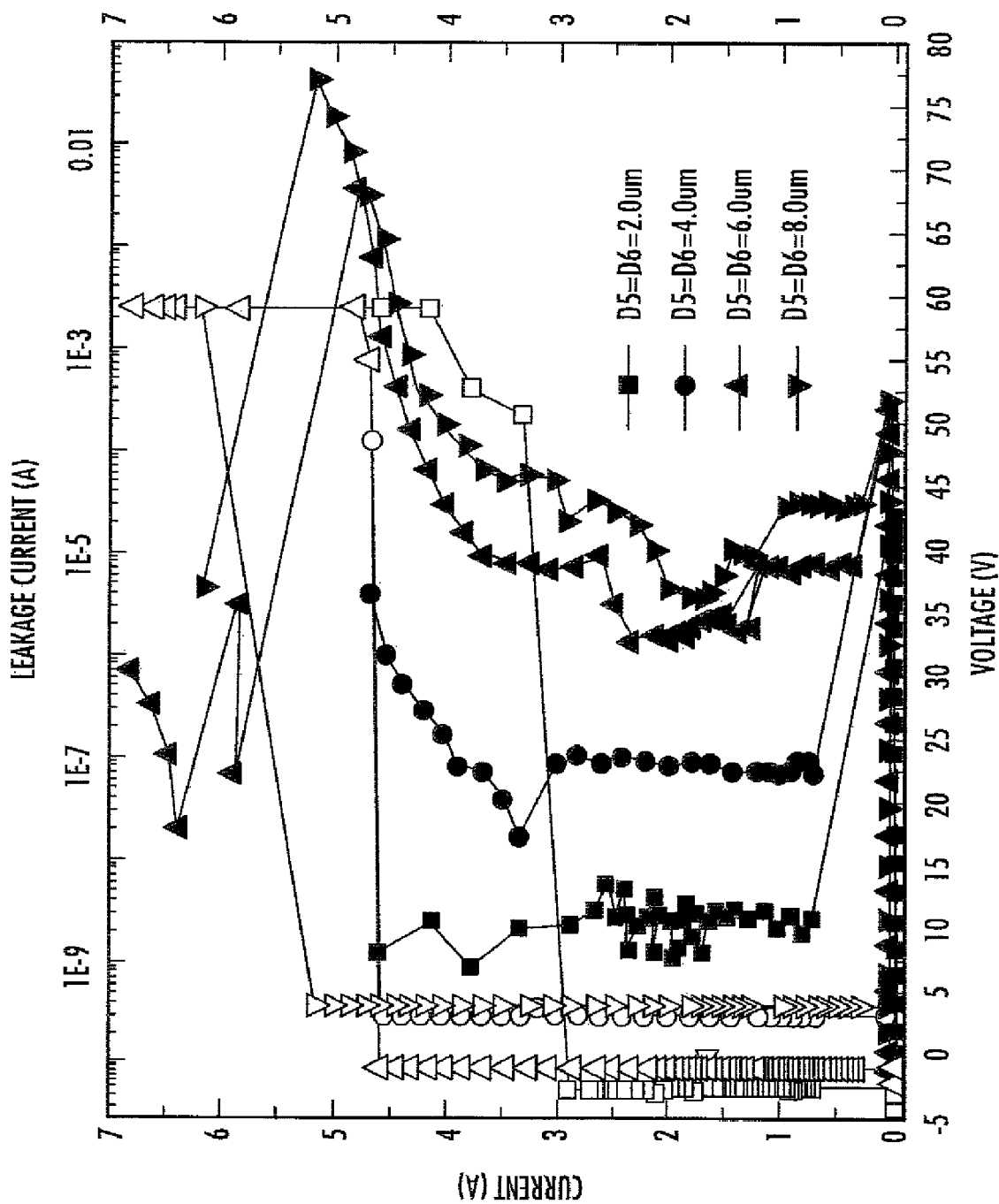

Changing the dimensions of D5 (the distance from the edge of the PNP emitter 18 and the breakdown junction 48) and D6 (the distance from the edge of the NPN emitter 24 and the breakdown junction 48) can also alter the ESD performance. FIG. 9 shows the TLP results of the 1:1/1:1 segment ratio SCR of FIG. 4 having four different D5 and D6 dimensions (with D5 and D6 being equal). When D5 and D6 is changed from 2 µm to 8 µm, the holding voltage is increased from 10 V to 45 V. Another advantage of increasing D5 and D6 is that the failure current $I_{t2}$ increases by about 31 mA/µm. D5 and D6 represent the base layer thicknesses of the PNP device and the NPN device respectively. While not intending to be bound by any particular theory, it is believed that the increased holding voltage results from a decrease in the current gain of the BJT devices when D5 and D6 are increased, and that the increased $I_{t2}$ results from the increased area of the SCR.

Figure 10A:
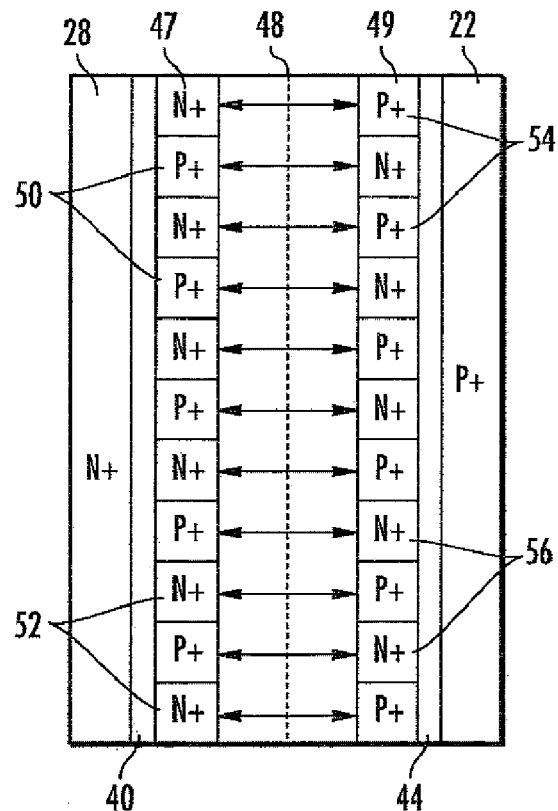
FIG. 10 is a plan view depicting two symmetrical segmented topology designs.
Figure 10B:
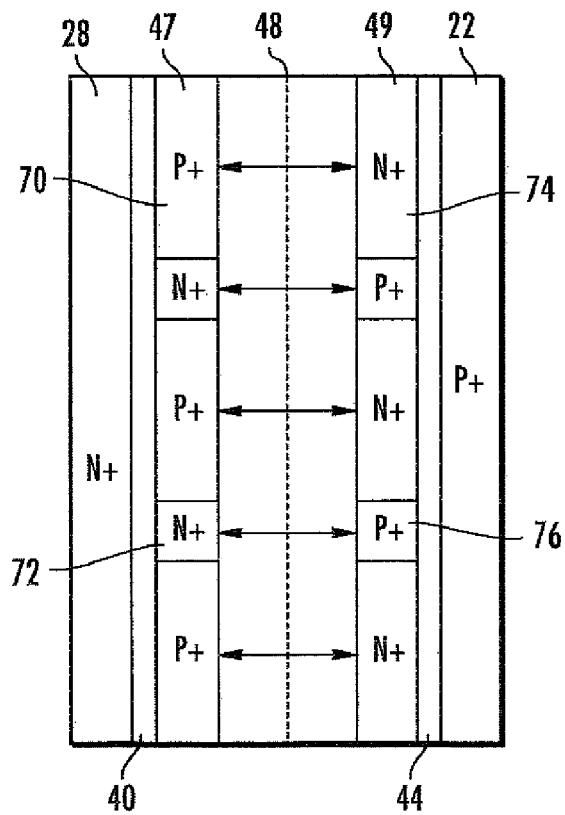

The devices depicted in FIGS. 4 and 7, for purposes of the present disclosure, can be referred to as having symmetrical emitter segmentations. The size of the original emitter segment on the anode side is the same as the original emitter segment on the cathode side, and the replaced emitter segment on the anode side is the same as the replaced emitter segment on the cathode side. In other words, in an anode/cathode segment ratio of A:B/X:Y, A=X and B=Y (the anode segment ratio being A:B and the cathode segment ratio being X:Y). FIG. 10 depicts partial reproductions of FIG. 4 (10A) and FIG. 7 (10B). For every doped PNP emitter segment, there is an analogous, similarly-sized but oppositely-doped NPN emitter segment located perpendicular across the breakdown junction. The horizontal arrows indicate that for every segment in PNP emitter area 47, there is a similar, oppositely-doped NPN emitter segment in NPN emitter area 49 at a direction perpendicular to the breakdown junction 48. Each analogous segment has a similar length (vertical direction) and width (horizontal direction), but opposite doping types.

FIG. 11 depicts three different asymmetrical emitter segmentation designs. With each design, the PNP collector, PNP emitter, and NPN collector are all doped uniformly to a single dopant concentration. The NPN emitter, however, comprises a segmented topology comprising both n-type regions and p-type regions.

The structure of FIG. 11A comprises a segment ratio of 1:0/1:2, or more simply 0/1:2. There are no anode emitter replacement segments (i.e. the anode emitter is entirely doped to a p-type conductivity and has only a p-type conductivity), and there is one original cathode emitter segment (N+) for every two replacement cathode emitter segments (P+). In other words, each P+ cathode emitter replacement segment is twice as long as the original cathode emitter segment.

The structure of FIG. 11B comprises a segment ratio of 0/1:1, as there are no anode emitter replacement segments and there is one original cathode emitter segment (N+) for each replacement cathode emitter segment (P+).

The structure of FIG. 11C comprises a segment ratio of 0/2:1, as there are no anode emitter replacement segments and there are two original cathode emitter segments (N+) for each replacement cathode emitter segment (P+).

The structure of FIG. 12 also depicts three different asymmetrical emitter segmentation designs. With each of these designs, the PNP collector, the NPN emitter, and the NPN collector are all uniformly doped to a single dopant concentration. The PNP emitter, however, comprises a segmented topology comprising both n-type regions and p-type regions.

The structure of FIG. 12A comprises a segment ratio of 1:2/1:0, or more simply 1:2/0. There is one original anode emitter segment (P+) for every two replacement anode emitter segments (N+), and there are no cathode emitter replacement segments.

Similarly, it follows that the structure of FIG. 12B comprises a segment ratio of 1:1/0, and the structure of FIG. 12C comprises a segment ratio of 2:1/0.

Figure 13:
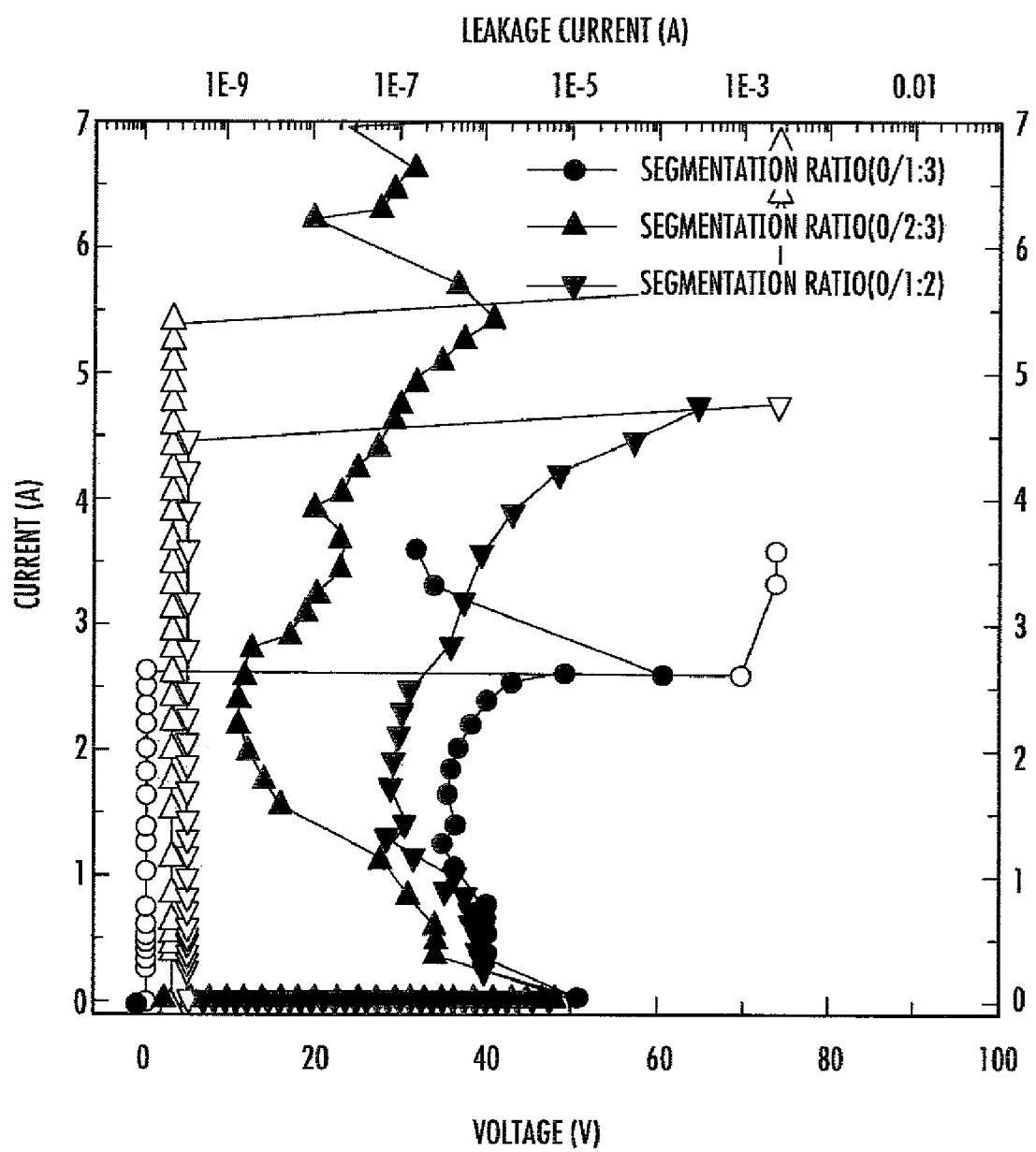
FIG. 13 is a graph depicting electrical characteristics of various asymmetrical segmented topology designs having both n-type and p-type doped regions on the NPN emitter and a single p-type doped region on the PNP emitter.
Figure 14:
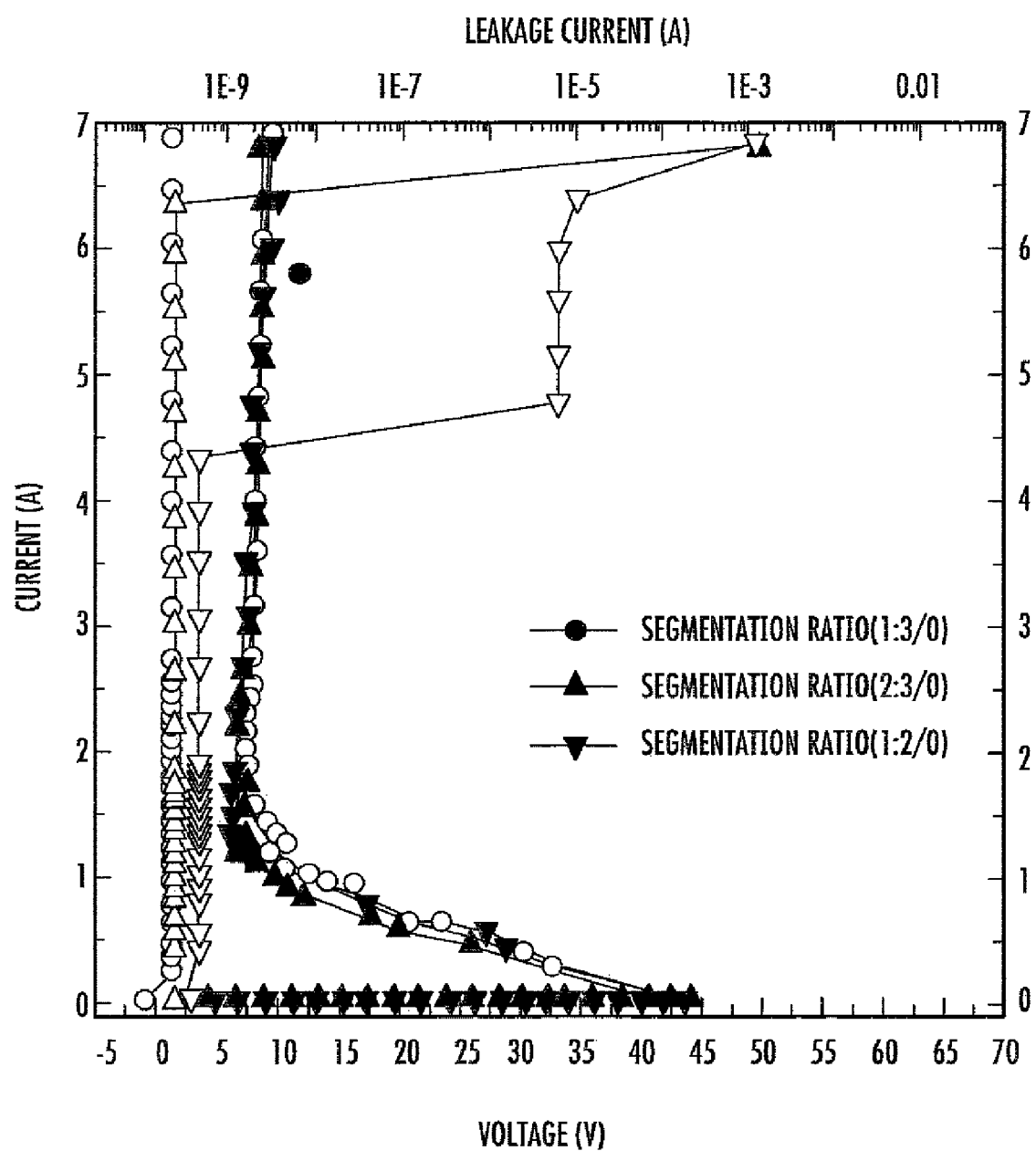
FIG. 14 is a graph depicting electrical characteristics of various asymmetrical segmented topology designs wherein the PNP emitter comprises regions having both n-type and p-type conductivity, and the NPN emitter comprises a single region having p-type conductivity.

FIG. 13 is a graph depicting the electrical characteristics for three exemplary asymmetrical segment topology designs in which the cathode emitter is segmented into ratios of 0/1:3, 0/2:3, and 0/1:2. FIG. 14 is a graph depicting the electrical characteristics for three exemplary asymmetrical segment topology designs in which the anode emitter is segmented into ratios of 1:3/0, 2:3/0, and 1:2/0. Results indicate that asymmetrical segmentation in the NPN emitter significantly alters the holding voltage $V_H$. However, asymmetrical segmentation of the PNP emitter has little effect on the holding voltage. Asymmetrically segmenting the cathode emitter in an SCR can increase $V_H$ from about 10 V to about 36 V. In addition to the change in $V_H$, the failure current $I_{t2}$ is also altered by the topology segmentation on the cathode side. For example, $I_{t2}$ decreases as the segmented ratio is increased from 0/1:2 to 0/1:1 to 0/2:1. The trade-off between holding voltage $V_H$ and failure current $I_{t2}$ can be considered when using the proposed devices for high-voltage ESD applications.

To manufacture the exemplary devices, a photoresist mask used to form each of the PNP emitter area 47 and the NPN emitter area 49 can be altered such that no additional masking steps are required. For example, separate N+ segments of both the PNP emitter and the NPN emitter can be implanted during a single N+ doping step by simultaneously exposing portions of the PNP emitter and the NPN emitter through openings in a first mask during N+ dopant implantation. Similarly, P+ regions of both the PNP emitter and the NPN emitter can be implanted during a single P+ doping step by simultaneously exposing portions of the PNP emitter and the NPN emitter through openings in a second mask during P+ implantation. Typical N+ doping concentrations in both the PNP and NPN emitters can be about $9 \times 10^{19}$ atoms/cm$^3$, and typical P+ doping concentrations in both PNP and NPN emitters can be about $6 \times 10^{19}$ atoms/cm$^3$.

Various embodiments of the SCR as presently described have been designed based on the concept that the holding voltage $V_H$ can be increased with reduced emitter injection efficiency in the SCR. Both symmetrically and asymmetrically segmented emitter topology have been disclosed to achieve this objective. In various embodiments, an asymmetrical design having dual doped regions (e.g. both n-type and p-type regions) on the cathode (NPN) emitter can be more effective than a design having dual doped regions on the anode (PNP) emitter. As described above, various inventive SCR embodiments can possess a holding voltage larger than 40 V and failure current $I_{t2}$ higher than 31 mA/µm, thus realizing a high holding voltage SCR adaptable for use as a supply clamping device for high-voltage ESD applications. This can be accomplished without additional masking steps in a device having a relatively small area while minimizing damage from ESD stress. Inventive embodiments can be suitable for use with CMOS and BiCMOS processing, for example in twin-well processes.

Further, even though the effective area of the emitters is reduced to increase $V_H$, the actual area is not reduced. As a result, problems found with a reduction in the actual emitter area, such as increased temperature a resulting decrease in current handling capability of the SCR, are avoided.

Use of various embodiments of the invention in liquid crystal display (LCD) driver circuits, telecommunication circuits, power switches, and automotive circuits is contemplated. Further, devices having a symmetrical segment ratio of one of 0/2:1, 0/1:1, 0/2:3, 0/1:2, 0/1:3, 2:1/0, 1:1/0, 2:3/0, 1:2/0, and 1:3/0, or having a segment ratio in the range from 3:1/3:1 to 1:3/1:3 inclusive, are contemplated.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A semiconductor device, comprising:
a PNP bipolar transistor comprising an emitter formed in a PNP emitter area, wherein the PNP emitter area comprises:
  at least two separate segments having a p-type conductivity;
  at least two separate segments having an n-type conductivity; and
an NPN bipolar transistor comprising an emitter formed in an NPN emitter area, wherein the NPN emitter area comprises:
  at least two separate segments having an n-type conductivity; and
  at least two separate segments having a p-type conductivity.

2. The semiconductor device of claim 1, wherein:
a width of each of the at least two separate segments in the PNP emitter area having the p-type conductivity is about equal to a width of each of the at least two separate segments in the PNP emitter area having the n-type conductivity; and
a width of each of the at least two separate segments in the NPN emitter area having the n-type conductivity is about equal to a width of each of the at least two separate segments in the NPN emitter area having the p-type conductivity.

3. The semiconductor device of claim 2, wherein:
the PNP emitter area comprises a length and a width;
the width of the PNP emitter area is equal to the width of each of the at least two separate segments having the p-type conductivity and to the width of the at least two separate segments having the n-type conductivity which comprise the PNP emitter area;
the NPN emitter area comprises a length and a width; and
the width of the NPN emitter area is equal to the width of each of the at least two separate segments having the p-type conductivity and to the width of the at least two separate segments having the n-type conductivity which comprise the NPN emitter area.

4. The semiconductor device of claim 2, wherein:
a length of each of the at least two separate segments having a p-type conductivity which comprise the PNP emitter area is about three times a length of each of the at least two separate segments having an n-type conductivity which comprise the PNP emitter area; and
a length of each of the at least two separate segments having an n-type conductivity which comprise the NPN emitter area is about three times a length of each of the at least two separate segments having an p-type conductivity which comprise the NPN emitter area.

5. The semiconductor device of claim 2, wherein:
a length of each of the at least two separate segments having a p-type conductivity which comprise the PNP emitter area is about two times a length of each of the at least two separate segments having an n-type conductivity which comprise the PNP emitter area; and
a length of each of the at least two separate segments having an n-type conductivity which comprise the NPN emitter area is about two times a length of each of the at least two separate segments having an p-type conductivity which comprise the NPN emitter area.

6. The semiconductor device of claim 2, wherein:
a length of each of the at least two separate segments having a p-type conductivity which comprise the PNP emitter area is about equal to a length of each of the at least two separate segments having an n-type conductivity which comprise the PNP emitter area; and
a length of each of the at least two separate segments having an n-type conductivity which comprise the NPN emitter area is about equal to a length of each of the at least two separate segments having an p-type conductivity which comprise the NPN emitter area.

7. The semiconductor device of claim 2, wherein the PNP bipolar transistor and the NPN bipolar transistor form an SCR with a symmetrical segment ratio of one of 3:1/3:1, 2:1/2:1, 1:1/1:1, 1:2/1:2 and 1:3/1:3.

8. The semiconductor device of claim 7, wherein each segment in the PNP emitter area is paired with an oppositely-doped NPN emitter segment in a direction perpendicular to a breakdown junction.

9. The semiconductor device of claim 2, wherein the PNP bipolar transistor and the NPN bipolar transistor form an SCR with a symmetrical segment ratio in the range from 3:1/3:1 to 1:3/1:3 inclusive.

10. The semiconductor device of claim 9, wherein each segment in the PNP emitter area is paired with an oppositely-doped NPN emitter segment in a direction perpendicular to a breakdown junction.

11. The semiconductor device of claim 2 having a holding voltage $V_H$ greater than about 35 volts.

12. The semiconductor device of claim 11 having a failure current $I_{t2}$ greater than about 5 amps.

* * * * *